(12) United States Patent
Ikura

(10) Patent No.: US 6,835,645 B2
(45) Date of Patent: Dec. 28, 2004

(54) METHOD FOR FABRICATING SEMICONDUCTOR DEVICE

(75) Inventor: Tsuneo Ikura, Ibaraki (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 89 days.

(21) Appl. No.: 09/942,907

(22) Filed: Aug. 31, 2001

(65) Prior Publication Data

US 2002/0064938 A1 May 30, 2002

(30) Foreign Application Priority Data

Nov. 29, 2000 (JP) ........................ 2000-362300

(51) Int. Cl.[7] .................... H01L 21/4763; H01L 21/44
(52) U.S. Cl. .................... 438/622; 438/623; 438/624; 438/627; 438/631; 438/637; 438/668; 438/692
(58) Field of Search ................... 438/622, 624, 438/627, 631, 637, 692, 623, 668

(56) References Cited

U.S. PATENT DOCUMENTS

| | | | | |
|---|---|---|---|---|
| 5,155,064 A | * | 10/1992 | Mise | 438/624 |
| 5,284,801 A | * | 2/1994 | Page et al. | 438/623 |
| 5,527,737 A | * | 6/1996 | Jeng | 438/623 |
| 5,635,428 A | * | 6/1997 | Martin et al. | 438/623 |
| 5,858,831 A | * | 1/1999 | Sung | 438/241 |
| 5,880,030 A | * | 3/1999 | Fang et al. | 438/701 |
| 5,981,333 A | * | 11/1999 | Parekh et al. | 438/253 |
| 5,990,558 A | * | 11/1999 | Tran | 257/759 |
| 6,077,738 A | * | 6/2000 | Lee et al. | 438/241 |
| 6,077,770 A | * | 6/2000 | Hsu | 438/622 |
| 6,124,200 A | * | 9/2000 | Wang et al. | 438/624 |
| 6,153,490 A | * | 11/2000 | Xing et al. | 438/396 |
| 6,165,837 A | * | 12/2000 | Kawakubo et al. | 438/244 |
| 6,187,624 B1 | * | 2/2001 | Huang | 438/253 |
| 6,255,151 B1 | * | 7/2001 | Fukuda et al. | 438/197 |
| 6,271,116 B1 | * | 8/2001 | Lou | 438/623 |
| 6,287,961 B1 | * | 9/2001 | Liu et al. | 438/638 |
| 6,365,453 B1 | * | 4/2002 | Deboer et al. | 438/253 |
| 6,372,635 B1 | * | 4/2002 | Wang et al. | 438/638 |
| 6,429,116 B1 | * | 8/2002 | Wang et al. | 438/623 |
| 6,562,711 B1 | * | 5/2003 | Powers | 438/622 |
| 6,627,493 B2 | * | 9/2003 | Tu et al. | 438/239 |

FOREIGN PATENT DOCUMENTS

JP 11-135620 5/1999

OTHER PUBLICATIONS

Wolf, Ph.D., Stanley, "Multilevel–Interconnect Technology for VLSI and USLI," Silicon Processing for the VLSI Era—vol. 2: Process Integration, Lattice Press, 1990, pp. 238–239.*

* cited by examiner

*Primary Examiner*—Mary Wilczewski
*Assistant Examiner*—Toniae M. Thomas
(74) *Attorney, Agent, or Firm*—Donald R. Studebaker; Nixon Peabody, LLP

(57) ABSTRACT

After forming, on a substrate, a first insulating film with a relatively low dielectric constant and low mechanical strength, the first insulating film is patterned. After forming, on the substrate, a second insulating film with a relatively high dielectric constant and high mechanical strength, the second insulating film is planarized by polishing, so as to form a thinned portion of the second insulating film on the patterned first insulating film. An interconnect groove is formed in the thinned portion of the second insulating film and the patterned first insulating film, and then, a buried interconnect is formed in the interconnect groove.

6 Claims, 8 Drawing Sheets

METHOD FOR FABRICATING SEMICONDUCTOR DEVICE

BACKGROUND OF THE INVENTION

The present invention relates to a method for fabricating a semiconductor device, and more particularly, it relates to a method for forming a low dielectric film locally in a region of an insulating film where capacitance between interconnects is desired to be lowered.

Recently, in accordance with the increased degree of integration and the increased performance and operation speed of semiconductor integrated circuit devices, metal interconnects have been further refined and formed in structures of a larger number of levels. As one of means for attaining the refinement and the multi-level structures, a technique to use, as an interlayer insulating film, an insulating film with a low dielectric constant (hereinafter referred to as a low dielectric insulating film) has been proposed.

When a low dielectric insulating film is used for forming an interlayer insulating film, capacitance between interconnects can be lowered so as to avoid a problem of signal delay.

However, most of currently examined low dielectric insulating films have disadvantages of weakness against impact due to low mechanical strength and a poor heat conducting property due to low thermal conductivity.

In a technique proposed for overcoming these disadvantages, a low dielectric insulating film is used in a region of an interlayer insulating film where signal delay can lead to a serious problem, and an insulating film having a high dielectric constant but having high mechanical strength and high thermal conductivity, such as a silicon oxide film, is used in a region of the interlayer insulating film where signal delay does not lead to a serious problem.

Now, a method for locally forming a low dielectric insulating film between interconnects disclosed in Japanese Laid-Open Patent Publication No. 11-135620 will be described with reference to FIGS. 8A through 8D.

First, as shown in FIG. 8A, after forming metal interconnects 11 on a semiconductor substrate 10, a resist pattern 12 is formed on a region of the semiconductor substrate 10 where capacitance between interconnects is particularly desired to be lowered.

Next, as shown in FIG. 8B, a silicon oxide film 13 is formed by liquid phase growth on a region of the semiconductor substrate 10 where the resist pattern 12 is not formed.

Then, as shown in FIG. 8C, after removing the resist pattern 12, a low dielectric insulating film 14 is formed on the entire face of the semiconductor substrate 10.

Subsequently, as shown in FIG. 8D, a portion of the low dielectric insulating film 14 present on the silicon oxide film 13 is removed by CMP, thereby placing the top faces of the silicon oxide film 13 and the low dielectric insulating film 14 at substantially the same level.

By repeatedly carrying out the aforementioned procedures, the low dielectric insulating film 14 can be selectively formed in regions where capacitance between interconnects is particularly desired to be lowered.

When the interconnect pitch is reduced as a result of reduction of semiconductor integrated circuit devices, however, it becomes difficult to fill the low dielectric insulating film between interconnects, which disadvantageously restricts the material for the low dielectric insulating film.

Also, since the low dielectric insulating film is generally poor in the mechanical strength, there arises a problem that defects such as peeling and scratch may be caused in the low dielectric insulating film in planarizing it by the CMP.

SUMMARY OF THE INVENTION

In consideration of the aforementioned conventional problems, an object of the invention is definitely forming a low dielectric insulating film between interconnects with a small interconnect pitch and preventing peeling or scratch of the low dielectric insulating film.

In order to achieve the object, the method for fabricating a semiconductor device of this invention comprises the steps of forming, on a substrate, a first insulating film with a relatively low dielectric constant and low mechanical strength; patterning the first insulating film through selective etching using a first mask pattern formed on a first region of the first insulating film; forming, on the substrate, a second insulating film with a relatively high dielectric constant and high mechanical strength; forming a thinned portion of the second insulating film on the patterned first insulating film by planarizing the second insulating film by polishing; forming a first interconnect groove in the thinned portion of the second insulating film and the patterned first insulating film through selective etching using a second mask pattern formed on the planarized second insulating film; and forming a buried interconnect in the first interconnect groove.

In the method for fabricating a semiconductor device of this invention, after forming the patterned first insulating film in the first region by patterning the first insulating film with a low dielectric constant and low mechanical strength, the second insulating film with a high dielectric constant and high mechanical strength is formed. Therefore, the first insulating film with a low dielectric constant can be present in the first region alone. Also, since the first insulating film with low mechanical strength is not exposed in planarizing the second insulating film with high mechanical strength by polishing, defects such as peeling and scratch can be prevented from being caused in the first insulating film. Furthermore, since the buried interconnect is formed by filling the metal film in the first interconnect groove formed in the first insulating film with a low dielectric constant, the first insulating film can be definitely disposed between interconnects even when the interconnect pitch is small.

The method for fabricating a semiconductor device preferably further comprises a step of forming, on the buried interconnect, a third insulating film for preventing diffusion of a metal included in the buried interconnect.

Thus, the metal included in the buried interconnect can be prevented from diffusing into the insulating film formed thereon.

In the method for fabricating a semiconductor device, both of the first insulating film and the second insulating film preferably include inorganic materials as principal constituents, and the step of forming the first interconnect groove preferably includes a sub-step of forming a second interconnect groove in a second region of the planarized second insulating film through selective etching using the second mask pattern.

Thus, the first interconnect groove and the second interconnect groove can be respectively formed in the first insulating film and the second insulating film through one selective etching.

Alternatively, in the method for fabricating a semiconductor device, it is preferred that the first insulating film includes an organic material as a principal constituent and that the second insulating film includes an inorganic material as a principal constituent, and the step of forming the first interconnect groove preferably includes a sub-step of forming a second interconnect groove in a second region of the planarized second insulating film through selective etching using the second mask pattern in forming an upper portion of the first interconnect groove in the thinned portion of the second insulating film through the selective etching using the second mask pattern.

Thus, a material with a low dielectric constant can be used for forming the first insulating film. Also, even when the first insulating film and the second insulating film are made from different materials, the first interconnect groove and the second interconnect groove can be respectively formed in the first insulating film and the second insulating film.

In this case, the step of forming the first interconnect groove preferably includes a sub-step of removing the second mask pattern in forming a lower portion of the first interconnect groove in the first insulating film through the selective etching using the second mask pattern.

Thus, the removal of the second mask pattern and the formation of the lower portion of the first interconnect groove in the first insulating film can be simultaneously carried out, resulting in reducing the number of procedures.

In the method for fabricating a semiconductor device, the thinned portion of the second insulating film preferably has a thickness of 10 nm through 50 nm.

Thus, the first insulating film with low mechanical strength can be definitely prevented from being subjected to CMP, and an insulating film present between the metal interconnect and an upper metal interconnect can be prevented from having a high dielectric constant.

DETAILED DESCRIPTION OF THE INVENTION

Embodiment 1

A method for fabricating a semiconductor device according to Embodiment 1 of the invention will now be described with reference to the accompanying drawings.

Figure 1A:
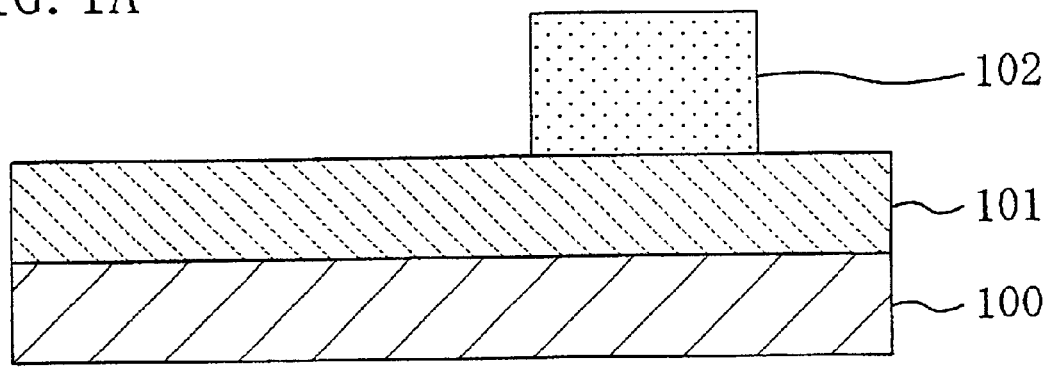
FIGS. 1A through 1C are cross-sectional views for showing procedures in a method for fabricating a semiconductor device according to Embodiment 1 of the invention.

First, as shown in FIG. 1A, a first insulating film 101 with a thickness of 500 nm of a low dielectric film including an inorganic material as a principal constituent, such as a hydrogen silsesquioxane (HSQ) film, is formed by spin coating over a semiconductor substrate 100 on which lower interconnects not shown are formed. Thereafter, a first resist pattern 102 with a thickness of 2.0 lm is formed by known lithography on a region of the first insulating film 101 where capacitance between interconnects is particularly desired to be lowered.

Figure 1B:
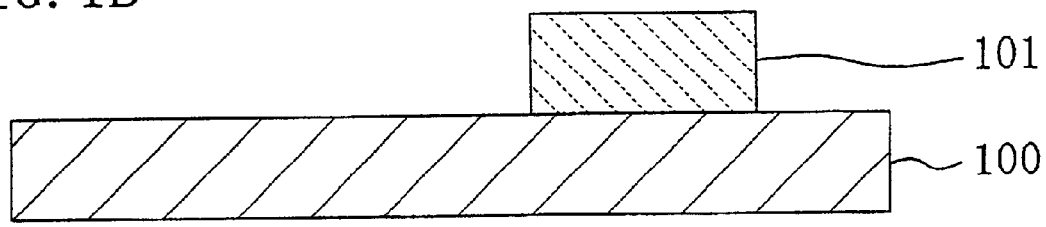

Next, the first insulating film 101 is patterned through etching by using the first resist pattern 102 as a mask and the first resist pattern 102 is then removed as shown in FIG. 1B. Thus, the first insulating film 101 remains merely in the region where capacitance between interconnects is particularly desired to be lowered.

Figure 1C:
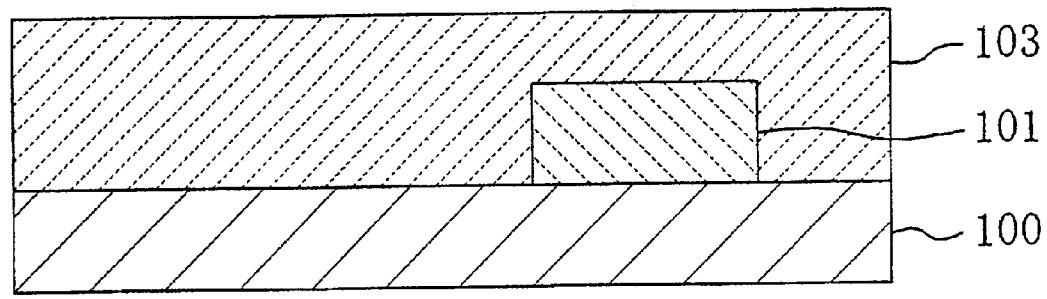

Then, as shown in FIG. 1C, a second insulating film 103 with a thickness of 700 nm of a plasma TEOS film (silicon oxide film) is formed by gas phase growth over the silicon substrate 100.

Figure 2A:
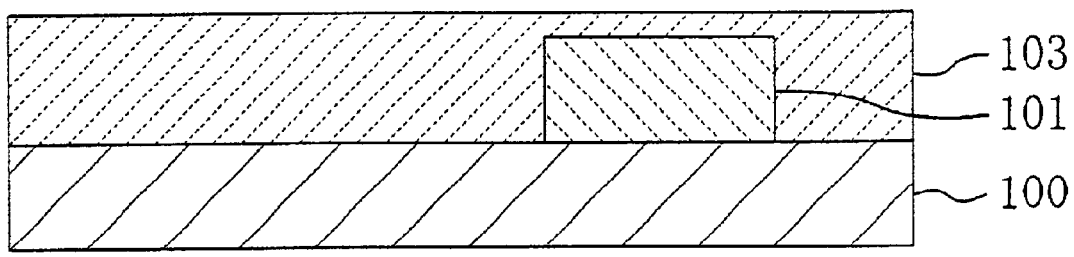
FIGS. 2A through 2C are cross-sectional views for showing other procedures in the method for fabricating a semiconductor device of Embodiment 1.

Thereafter, as shown in FIG. 2A, the second insulating film 103 is planarized and reduced in its thickness by CMP, so that a portion of the second insulating film 103 present on the first insulating film 101 have a thickness of approximately 10 nm through 50 nm. At this point, since the first insulating film 101 is not subjected to the CMP, defects such as scratch are not caused in the first insulating film 101, that is, the low dielectric film.

Figure 2B:
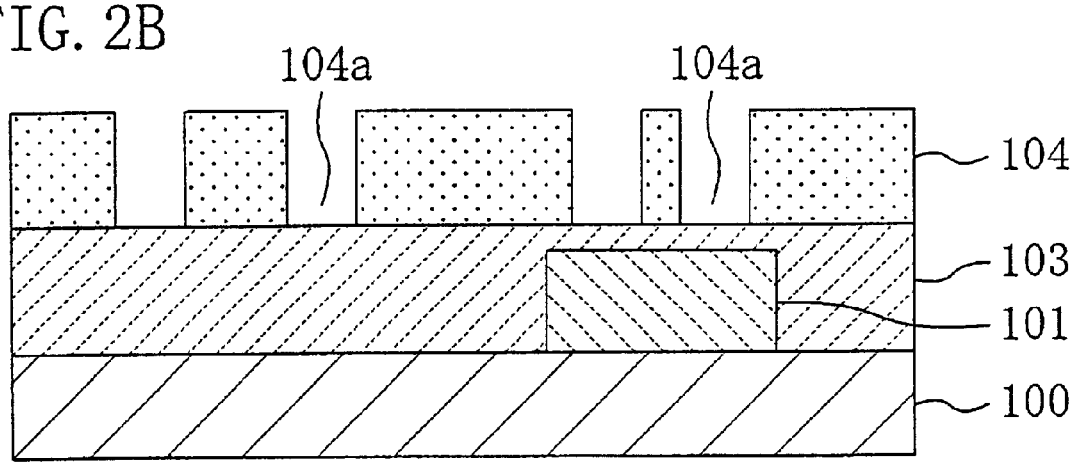
Figure 2C:
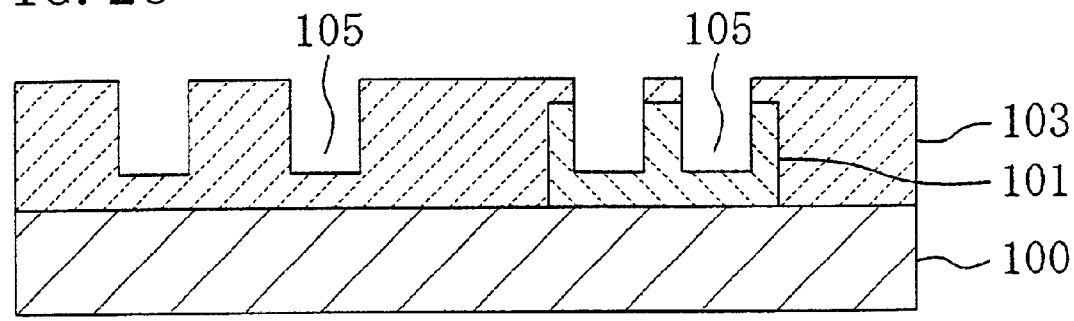

Next, as shown in FIG. 2B, a second resist pattern 104 having openings 104a in interconnect groove forming regions is formed on the second insulating film 103. Thereafter, the first insulating film 101 and the second insulating film 103 are etched by using an etching gas of, for example, a mixed gas of a $CHF_3$ gas and a $CF_4$ gas with the second resist pattern 104 used as a mask. Thus, interconnect grooves 105 each having a depth of approximately 250 nm are formed in the first insulating film 101 and the second insulating film 103 as shown in FIG. 2C.

Figure 3A:
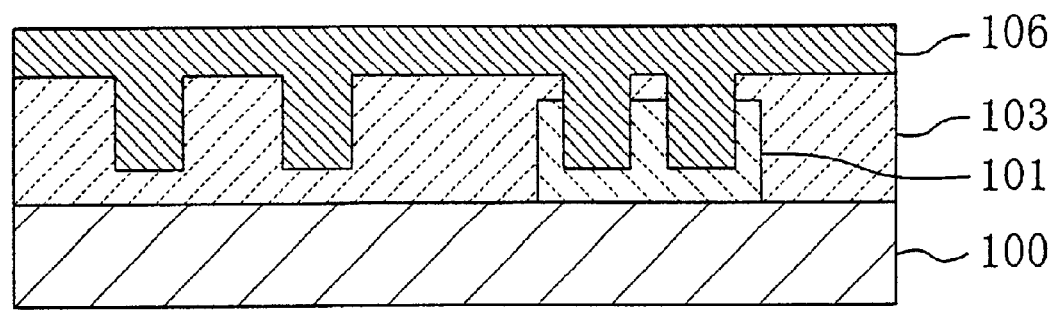
FIGS. 3A through 3C are cross-sectional views for showing still other procedures in the method for fabricating a semiconductor device of Embodiment 1.

Subsequently, as shown in FIG. 3A, a barrier metal layer of tantalum nitride and a seed layer of copper are successively deposited over the second insulating film 103 including the insides of the interconnect grooves 105, and then, a copper film is grown on the seed layer by electro plating. Thus, a metal film 106 composed of the barrier metal layer, the seed layer and the copper film is deposited so as to fill the interconnect grooves 105.

Figure 3B:
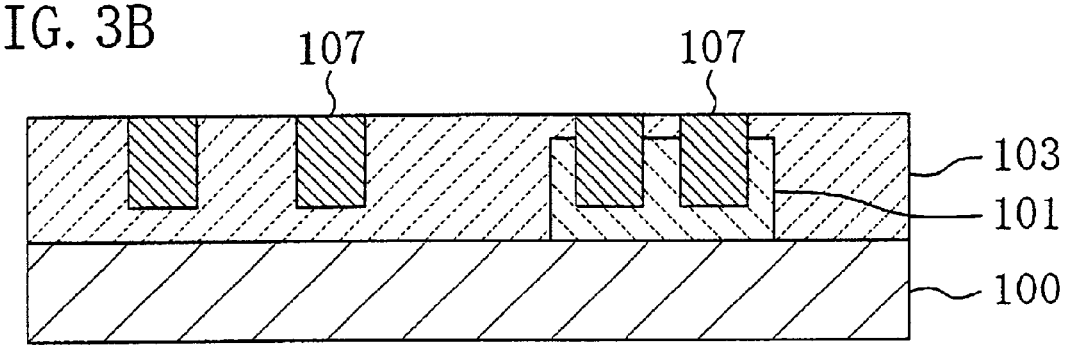
Figure 3C:
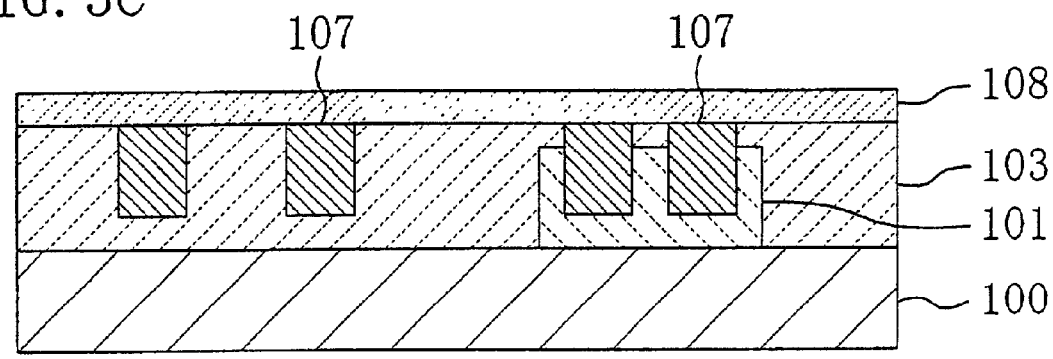

Next, as shown in FIG. 3B, a portion of the metal film 106 present on the second insulating film 103 is removed by the CMP, so as to form metal interconnects 107 serving as buried interconnects. Thereafter, as shown in FIG. 3C, a third insulating film 108 of a silicon carbide film with a thickness of 50 nm for preventing diffusion of copper included in the metal interconnects 107 is formed by plasma CVD on the metal interconnects 107 and the second insulating film 103.

In the fabrication method of Embodiment 1, since there is no need to fill a low dielectric film between metal interconnects with a small interconnect pitch, a low dielectric material can be definitely disposed between the metal interconnects with a small interconnect pitch. Also, since the method does not include a step of filling a low dielectric material in a small space between the metal interconnects, the material for the low dielectric film can be selected from a wide range.

The CMP for planarizing and reducing the thickness of the second insulating film 103 is carried out merely on the second insulating film 103 of a silicon oxide film that is comparatively resistant to polishing and is not carried out on the first insulating film 101 of a HSQ film that is comparatively unresistant to polishing. Therefore, defects such as peeling and scratch are not caused in the first insulating film 101.

The thickness of the portion of the second insulating film 103 present on the first insulating film 101 is reduced to approximately 10 nm through 50 nm by the CMP for the following reason: When the portion of the second insulating film 103 present on the first insulating film 101 has a thickness smaller than 10 nm, the first insulating film 101 may be partially exposed owing to variation in the reduced thickness of the second insulating film 103. Specifically, the first insulating film 101 may be subjected to the CMP, and hence, there is a fear of defects such as peeling and scratch caused in the first insulating film 101. On the other hand, when the portion of the second insulating film 103 present on the first insulating film 101 has a thickness larger than 50 nm, an insulating film present between the metal interconnects 107 and upper metal interconnects formed on the third insulating film 108 unavoidably has a high dielectric constant.

Embodiment 2

Figure 4A:
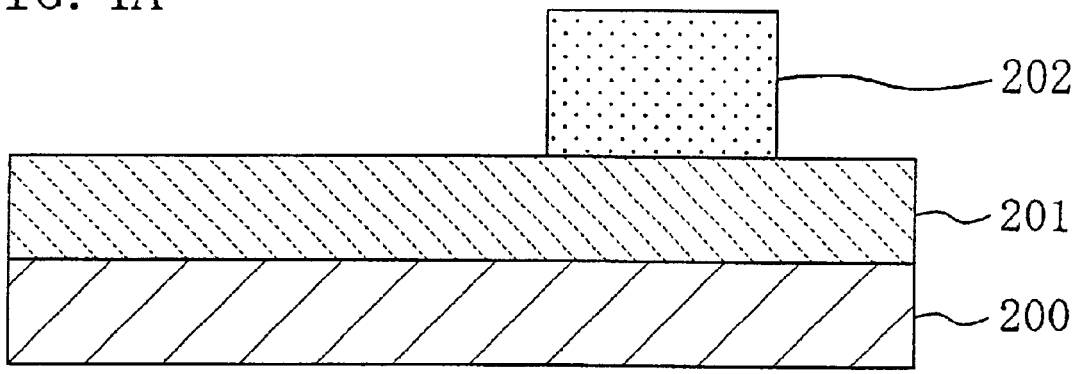
FIGS. 4A through 4C are cross-sectional views for showing procedures in a method for fabricating a semiconductor device according to Embodiment 2 of the invention.
Figure 4B:
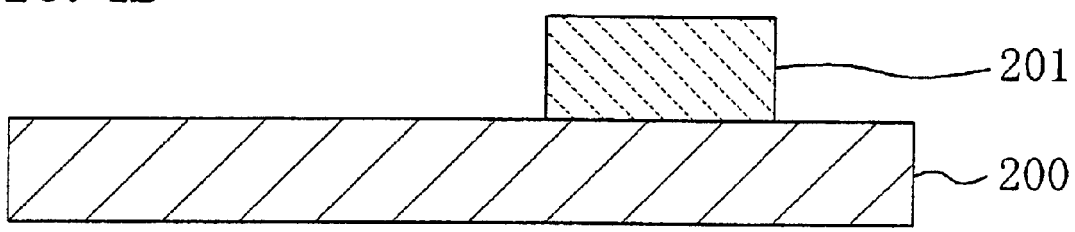

First, as shown in FIG. 4A, a first insulating film 201 with a thickness of 500 nm of a low dielectric film including an organic material as a principal constituent, such as an amorphous carbon film, is formed by the spin coating over a silicon substrate 200 on which lower interconnects not shown are formed. Thereafter, a first resist pattern 202 with a thickness of 2.0 lm is formed by known lithography on a region of the first insulating film 201 where capacitance between interconnects is particularly desired to be lowered.

Next, as shown in FIG. 2B, the first insulating film 201 is etched by using an etching gas of, for example, a mixed gas of a $H_2$ gas and a $N_2$ gas with the first resist pattern 202 used as a mask, thereby patterning the first insulating film 201, and thereafter, the first resist pattern 202 is removed. Thus, the first insulating film 201 remains merely in the region where capacitance between interconnects is particularly desired to be lowered.

Figure 4C:
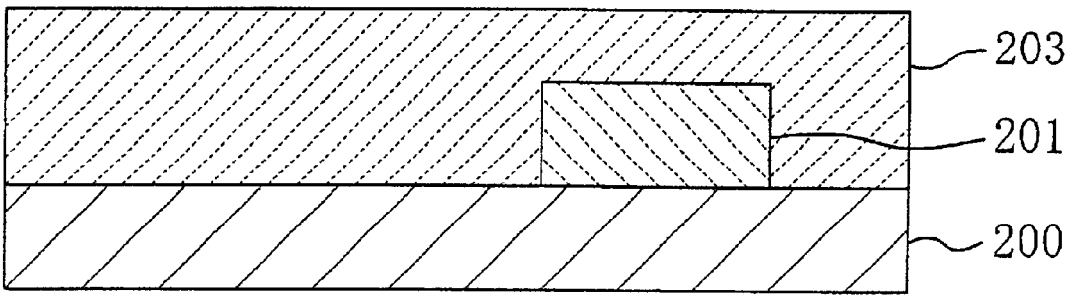

Then, as shown in FIG. 4C, a second insulating film 203 with a thickness of 700 nm of a plasma TEOS film (silicon oxide film) is formed over the silicon substrate 200 by the gas phase growth.

Figure 5A:
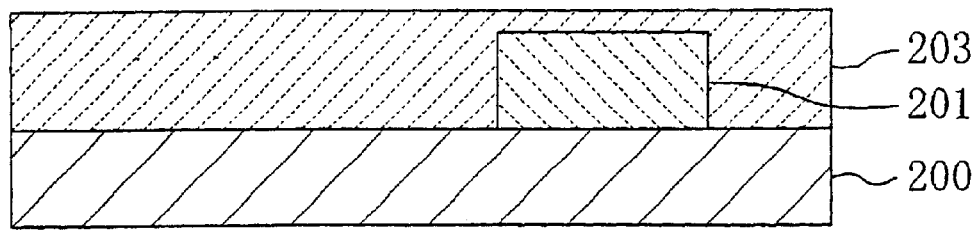
FIGS. 5A through 5D are cross-sectional views for showing other procedures in the method for fabricating a semiconductor device of Embodiment 2.

Thereafter, as shown in FIG. 5A, the second insulating film 203 is planarized and reduced in its thickness by the CMP, so that a portion of the second insulating film 203 present on the first insulating film 201 have a thickness of approximately 10 nm through 50 nm. At this point, since the first insulating film 201 is not subjected to the CMP, defects such as scratch are not caused in the first insulating film 201, that is, the low dielectric film.

Figure 5B:
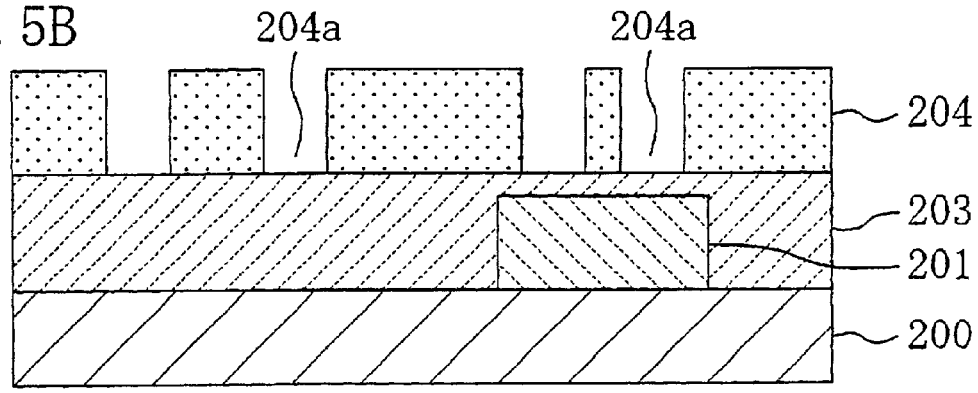

Next, as shown in FIG. 5B, a second resist pattern 204 having openings 204a in interconnect groove forming regions is formed on the second insulating film 203.

Figure 5C:
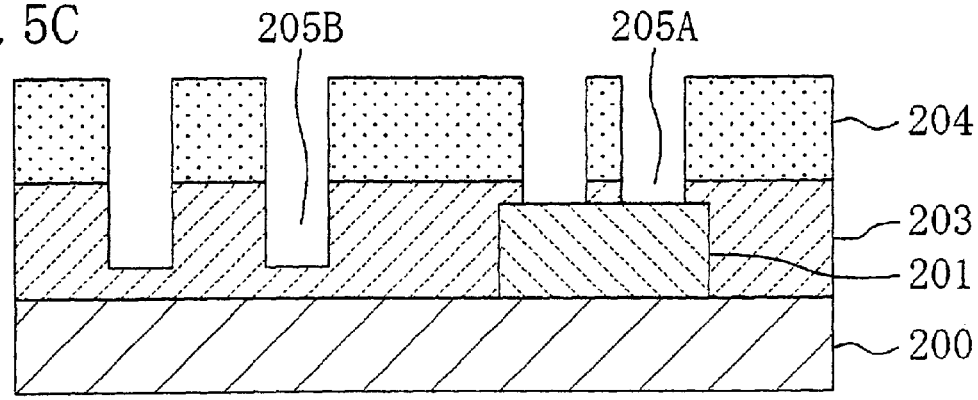

Then, the second insulating film 203 is etched by using an etching gas of, for example, a mixed gas of a $CHF_3$ gas and a $CF_4$ gas with the second resist pattern 204 used as a mask, so as to form upper portions of first interconnect grooves 205A in a first region of the second insulating film 203 and form second interconnect grooves 205B in a second region of the second insulating film 203 as shown in FIG. 5C.

Figure 5D:
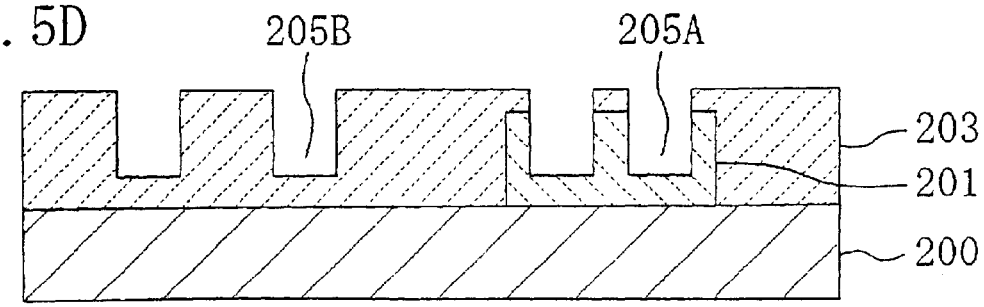

Subsequently, the first insulating film 201 is etched by using an etching gas of, for example, a mixed gas of a $H_2$ gas and a $N_2$ gas with the second resist pattern 204 used as a mask, so as to form lower portions of the first interconnect grooves 205A in the first insulating film 201 and remove the second resist pattern 204 as shown in FIG. 5D.

Figure 6A:
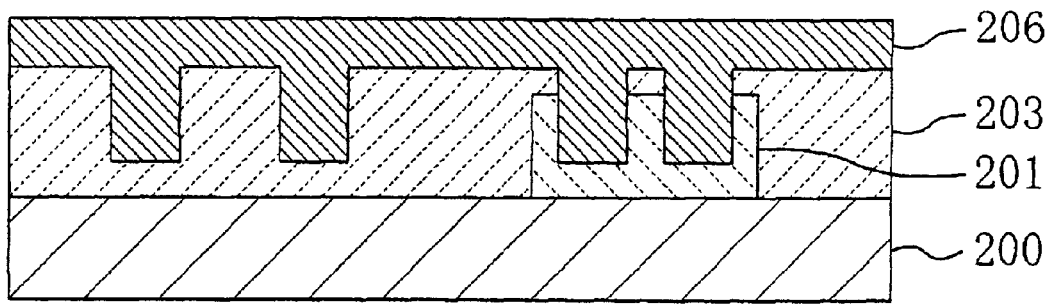
FIGS. 6A through 6C are cross-sectional views for showing still other procedures in the method for fabricating a semiconductor device of Embodiment 2.

Then, as shown in FIG. 6A, a barrier metal layer of tantalum nitride and a seed layer of copper are successively deposited over the second insulating film 203 including the insides of the first interconnect grooves 205A and the second interconnect grooves 205B, and then, a copper film is grown on the seed layer by the electro plating. Thus, a metal film 206 composed of the barrier metal layer, the seed layer and the copper film is deposited.

Figure 6B:
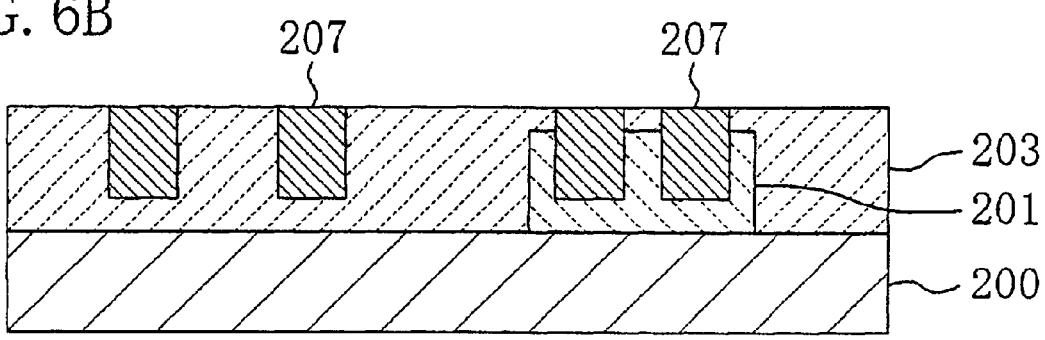
Figure 6C:
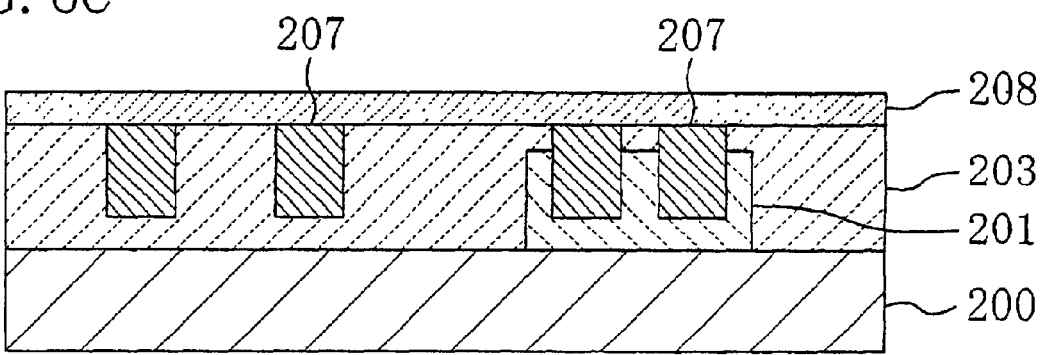

Next, as shown in FIG. 6B, a portion of the metal film 206 present on the second insulating film 203 is removed by the CMP, so as to form metal interconnects 207. Thereafter, as shown in FIG. 6C, a third insulating film 208 of a silicon carbide film with a thickness of 50 nm for preventing diffusion of copper included in the metal interconnects 207 is formed by the plasma CVD on the metal interconnects 207 and the second insulating film 203.

In the fabrication method of Embodiment 2, since there is no need to fill a low dielectric film between metal interconnects with a small interconnect pitch, a low dielectric material can be definitely disposed between the metal interconnects with a small interconnect pitch. Also, since the method does not include a step of filling a low dielectric material in a small space between the metal interconnects, the material for the low dielectric film can be selected from a wide range.

The CMP for planarizing and reducing the thickness of the second insulating film 203 is carried out merely on the second insulating film 203 of a silicon oxide film that is comparatively resistant to polishing and is not carried out on the first insulating film 201 of an amorphous carbon film that is comparatively unresistant to polishing. Therefore, defects such as peeling and scratch are not caused in the first insulating film 201.

Furthermore, by using the second resist pattern 204, the upper portions of the first interconnect grooves 205A and the second interconnect grooves 205B can be respectively formed in the first region and the second region of the second insulating film 203.

Moreover, since the formation of the lower portions of the first interconnect grooves 205A in the first insulating film 201 and the removal of the second resist pattern 204 can be simultaneously carried out, the number of procedures can be reduced.

Figure 7:
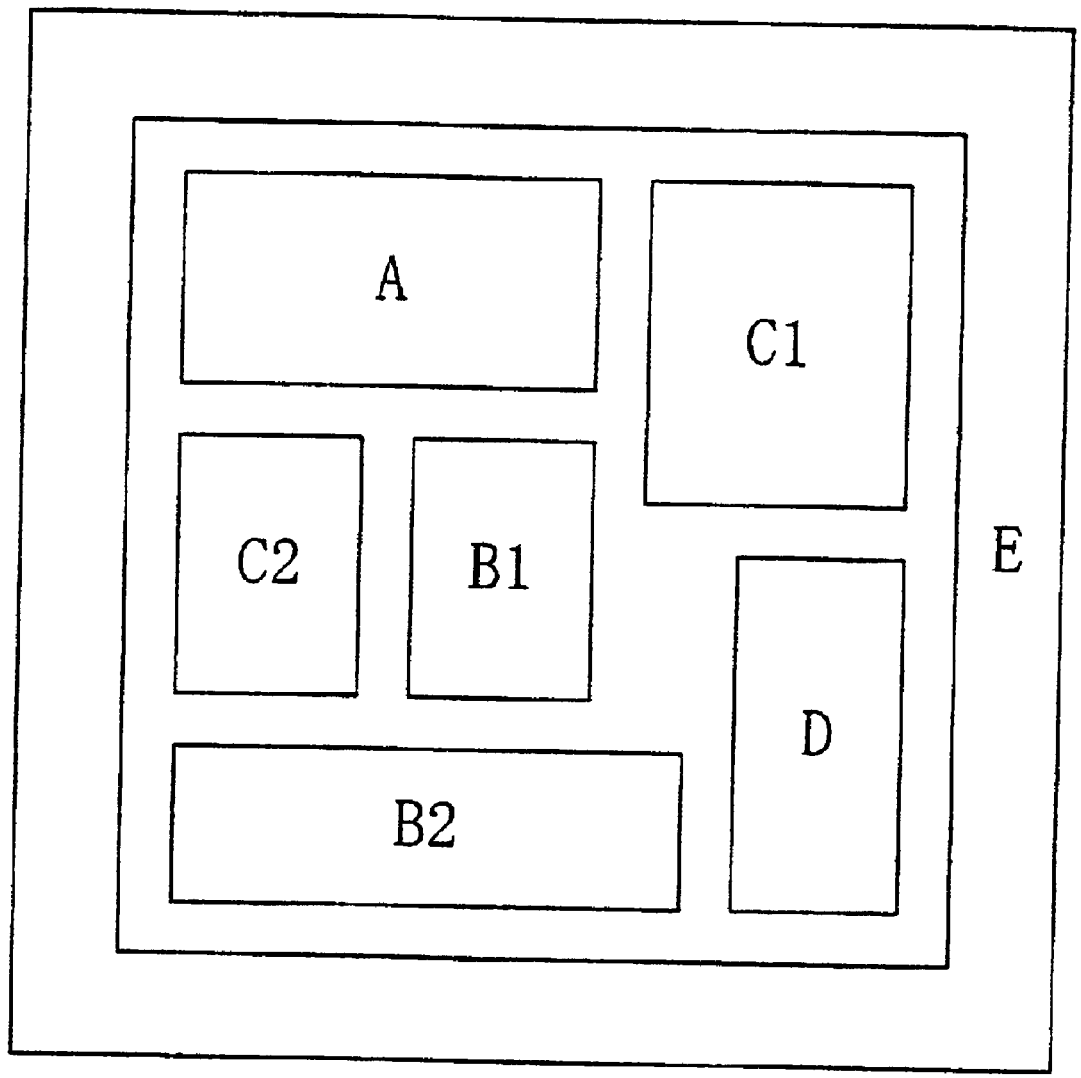
FIG. 7 is a plane view for explaining a region where capacitance between interconnects is particularly desired to be lowered in a semiconductor integrated circuit device.
Figure 8A:
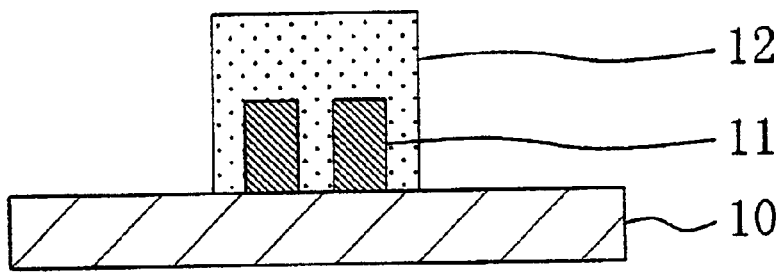
FIGS. 8A through 8D are cross-sectional views for showing procedures in a conventional method for fabricating a semiconductor device.
Figure 8B:
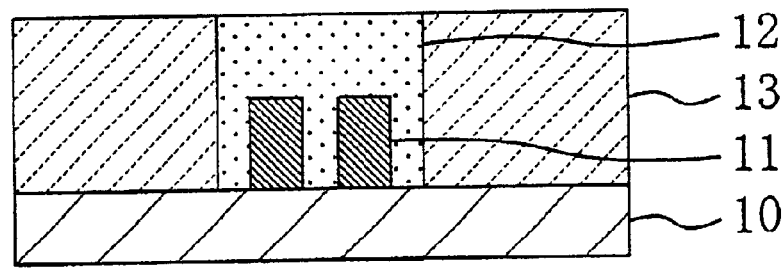
Figure 8C:
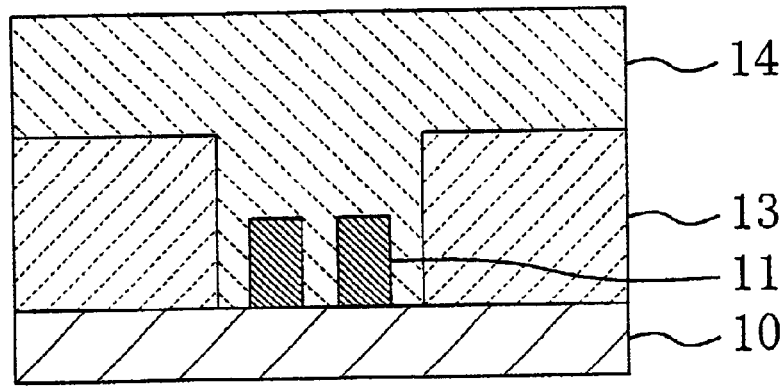
Figure 8D:
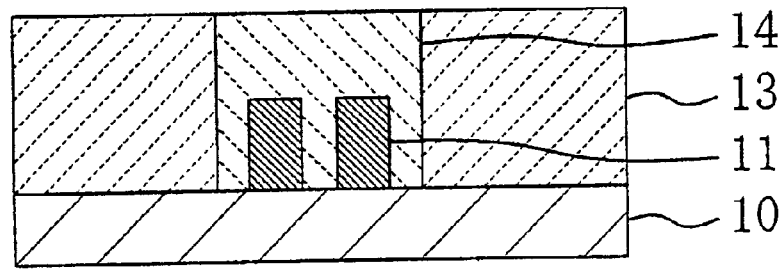

FIG. 7 shows an example of the layout of a semiconductor integrated circuit device (system LSI chip), in which a CPU core block A, a logic circuit block B1, a logic circuit block B2, a DRAM array block C1, a DRAM array block C2 and an SRAM array block D are provided on a silicon substrate. In the peripheral portion on the silicon substrate, a bonding pad region E is provided so as to surround these functional blocks. In such a semiconductor integrated circuit device, interconnects for mutually connecting the functional blocks (block-to-block interconnects) are formed.

In each of the aforementioned embodiments, the block-to-block interconnects for connecting functional blocks are formed in the region where the low dielectric film is formed. As a result, interconnect speed can be secured in regions between the functional blocks where interconnect delay leads to a serious problem.

In this manner, the block-to-block interconnects are formed in the region where the low dielectric film is formed in each of the embodiments, thereby lowering capacitance between interconnects and preventing interconnect delay.

Furthermore, in each of the embodiments, the bonding pad region is formed not from a low dielectric film but from a silicon oxide film with high mechanical strength because large stress is applied to this region in a bonding process.

What is claimed is:

1. A method for fabricating a semiconductor device comprising the steps of:

forming on a substrate, a first insulating film with a relatively low dielectric constant and low mechanical strength;

partially retaining said first insulating film in a first region through selective etching using a first mask pattern formed on said first insulating film;

forming a second insulating film with a relatively high dielectric constant and high mechanical strength, such that said second insulating film covers said retained first insulating film;

forming a thinned portion of said second insulating film on said retained first insulating film by planarizing said second insulating film by polishing;

forming a first interconnect groove in said thinned portion of said second insulating film and said retained first insulating film through selective etching said thinned portion of said second insulating film and said retained first insulating film using a second mask pattern formed on said thinned portion of said second insulating film; and forming a buried interconnect in said first interconnect groove, wherein said thinned portion of said second insulating film and said retained first insulating film are provided on the sides of said buried interconnect, said first insulating film includes an organic material as a principal constituent and said second insulating film includes an inorganic material as a principal constituent, the step of forming said first interconnect groove includes a sub-step of forming a second interconnect groove in a second region, which is different from the first region, of said second insulating film through selective etching using said second mask pattern in forming an upper portion of said first interconnect groove in said thinned portion of said second insulating film through the selective etching using said second mask pattern, and the step of forming said first interconnect groove includes a sub-step of removing said second mask pattern in forming a lower portion of said first interconnect groove in said first insulating film.

2. A method for fabricating a semiconductor device comprising the steps of:

forming, on a substrate, a first insulating film with a relatively low dielectric constant and low mechanical strength;

partially retaining said first insulating film in a first region through selective etching using a first mask pattern formed on said first insulating film;

forming a second insulating film with a relatively high dielectric constant and high mechanical strength, such that said second insulating film covers said retained first insulating film;

forming a thinned portion of said second insulating film on said retained first insulating film by planarizing said second insulating film by polishing;

forming a first interconnect groove in said thinned portion of said second insulating film and said retained first insulating film through selective etching said thinned portion of said second insulating film and said retained first insulating film using a second mask pattern formed on said thinned portion of said second insulating film; and forming a buried interconnect in said first interconnect groove, wherein said thinned portion of said second insulating film and said retained first insulating film are provided on the sides of said buried interconnect, and wherein said thinned portion of said second insulating film has a thickness of 10 nm through 50 nm.

3. A method for fabricating a semiconductor device comprising the steps of:

forming on a substrate, a first insulating film with a relatively low dielectric constant and low mechanical strength;

partially retaining said first insulating film in a first region through selective etching using a first mask pattern formed on said first insulating film;

forming a second insulating film with a relatively high dielectric constant and high mechanical strength, such that said second insulating film covers said retained first insulating film;

forming a thinned portion of said second insulating film on said retained first insulating film by planarizing said second insulating film by polishing;

forming a first interconnect groove in said thinned portion of said second insulating film and said retained first insulating film through selective etching said thinned portion of said second insulating film and said retained first insulating film using a second mask pattern formed on said thinned portion of said second insulating film; and forming a buried interconnect in said first interconnect groove, wherein said thinned portion of said second insulating film and said retained first insulating film are provided on the sides of said buried interconnect, and a thickness of said thinned portion of said second insulating film in said first region is smaller than a thickness of said second insulating film in a second region, which is different from said first region.

4. The method for fabricating a semiconductor device of claim 3, further comprising a step of forming, on said buried interconnect, a third insulating film for preventing diffusion of a metal included in said buried interconnect.

5. The method for fabricating a semiconductor device of claim 3, wherein both of said first insulating film and said second insulating film include inorganic materials as principal constituents, and the step of forming said first interconnect groove includes a sub-step of forming a second interconnect groove in a second region, which is different from the first region, of said second insulating film through selective etching using said second mask pattern.

6. The method for fabricating a semiconductor device of claim 3, wherein the step of forming said first interconnect groove includes a sub-step of forming a second interconnect groove in a second region, which is different from said first region, of said second insulating film through selective etching of said second insulating film using said second mask pattern.

* * * * *